United States Patent

[11] 3,619,285

[72] Inventor Nathan Feldstein
Kendall Park, N.J.
[21] Appl. No. 883,984
[22] Filed Dec. 10, 1969
[45] Patented Nov. 9, 1971
[73] Assignee RCA Corporation

[54] METHOD OF MAKING A PATTERNED METAL FILM ARTICLE
14 Claims, No Drawings

[52] U.S. Cl. .......... 117/212, 96/36, 96/36.2, 117/47 A, 117/213
[51] Int. Cl. .......... G03c 5/00, C23b 5/62
[50] Field of Search .......... 96/36, 36.2, 36.4; 117/212, 47 A, 160, 213

[56] References Cited

UNITED STATES PATENTS

| | | | |
|---|---|---|---|
| 3,415,679 | 10/1968 | Chuss | 117/212 |
| 3,148,098 | 9/1964 | Beste, Jr. | 156/18 X |
| 3,006,819 | 10/1961 | Wilson et al. | 117/212 X |
| 2,073,313 | 3/1937 | Murray | 96/36.2 X |

*Primary Examiner*—Alfred L. Leavitt
*Assistant Examiner*—Alan Grimaldi
*Attorney*—Glenn H. Bruestle

ABSTRACT: A method of making a patterned metal film article comprising depositing an organic resist material on the surface of a relatively nonporous insulating substrate in the pattern desired for the metal, leaving portions of the substrate surface exposed, treating both the exposed substrate surface portions and the resist surface with a sensitizer and with an activator for electroless deposition of a metal on both these surfaces, treating both said surfaces with an etching solution so that only the exposed substrate surface portions become deactivated, and treating both the surfaces with an electroless metal plating solution such that metal deposits only on the resist surface.

METHOD OF MAKING A PATTERNED METAL FILM ARTICLE

BACKGROUND OF THE INVENTION

Many types of electronic apparatus utilize circuits in which the components are connected by film-type conductors. The film-type conductors can be deposited by any one of various methods depending upon the degree of resolution desired and other factors such as complexity of the circuit, type of components to be used, power to be dissipated, and the like.

In microminiaturized monolithic circuits, conductors are usually deposited by evaporation techniques because of the rigid requirements for a high degree of resolution. On the other hand, so-called "printed" circuit boards used in radio and television apparatus conventionally have utilized film-type conductors made by etching a pattern in copper foil laminated to a substrate comprising plies of cloth impregnated with a phenolic resin. In this type of process, a great deal of metal is wasted. Moreover, resolution is limited because of undercutting during etching, and the method becomes impractical as the size of the substrate is reduced to save space and cost.

Because of the cost and waste involved in using metal etching techniques, other methods of depositing conductors have been developed. One of these involves screening techniques in which a ceramic substrate is used and the screened-on composition comprises primarily silver and palladium metal particles, an organic vehicle and a glass frit. Although this method is less expensive than the etching method, it still has the disadvantage of limited resolution.

In order to have the advantage of both good resolution and low cost, processes have been proposed involving electroless deposition of metal in a defined pattern on a substrate with no etching involved. In an electroless deposition process, a dielectric substrate is first sensitized and activated by depositing nuclei of a metal which catalyzes the reduction of a solution of a compound of a particular metal, and then the activated surface is treated with a solution of the metal being deposited so that the metal compound is reduced and metal plates out on the substrate.

When utilizing electroless metal deposition in a method which does not require etching, the entire substrate surface may first be sensitized and activated. Then a pattern of resist is put down, leaving the areas to be plated with metal exposed. Next, the entire surface is treated with an electroless metal-depositing solution and metal deposits only on the exposed substrate areas. Resolution is excellent since the resist pattern, itself, is capable of very high resolution and the edges of the resist serve as "forms" for the metal deposit. A disadvantage of this method is that, since metal ions are deposited over the entire surface of the substrate during the activation step, low-resistivity paths between conductors may remain on the substrate when processing is complete. These may lead to electrical breakdown when the circuit is in use.

Another method circumvents the disadvantage of conductive paths of the substrate by first putting down a resist pattern, then sensitizing and activating with a solution containing an ingredient that prevents the sensitizer and activator from acting on the resist pattern while permitting their usual action on the exposed substrate. Thus, when all surfaces are later treated with an electroless metal-depositing solution, metal deposits only on the exposed substrate areas and not on the resist.

In the electroless metal deposition methods that have been described, metal is deposited on the exposed substrate surfaces. It is also desirable for some applications, however, that the metal deposit on a resist pattern and not on the exposed substrate. This is the case, for example, when a pattern of metal is deposited only temporarily on a substrate and is later to be lifted off and become a self-supporting article.

OBJECTS OF THE INVENTION

An object of the invention is to provide an improved method of electrolessly depositing metal in a pattern.

Another object of the invention is to provide an improved method of making a metal article composed of a pattern of connected metal film portions.

DESCRIPTION OF PREFERRED EMBODIMENTS

An example of carrying out the method of the invention will be given as applied to making a fine metal mesh screen such as might be used in a target electrode in a pickup tube.

A surface of a flat glass plate is thoroughly cleaned by treating it will a detergent solution, then with a solution of sulfuric acid and potassium dichromate, and rinsing with deionized water.

The cleaned surface is then evenly coated with a thin layer (i.e., about 2,000 A) of a suitable photoresist such as polyvinyl alcohol sensitized with a dichromate or fish glue sensitized with a dichromate. After drying, the photoresist layer is exposed to a mesh pattern of light and shadow which is the negative of the screen desired, then developed with water, leaving a pattern of resist that was rendered insoluble in water by exposure to light.

The resist pattern and substrate are sensitized and activated in a conventional manner. Sensitization may be carried out by treating the entire surface with a solution containing 10 g. per liter of stannous chloride and 10 cc. per liter of 37 percent (by weight) hydrochloric acid. Sensitization is followed by a rinsing step.

After the rinsing step, the entire surface is treated with an activating solution comprising, per liter, 1 g. of palladium chloride and 1 cc. hydrochloric acid, 37 percent (by weight). The activated surface is then rinsed with water again and dried.

After the activation treatment, the unit may be briefly baked on a hot plate at 200° C. for 15 seconds, in the case of polyvinyl alcohol resist. However, the baking can be omitted in the case of the fish glue resist.

The next step of the process is to treat the entire surface in such a way as to deactivate the exposed surface of the substrate but not the surface of the resist pattern. This is accomplished by treating the entire surface with an etchant. Suitable etchants are 30 percent (by volume) nitric acid, 15 percent (by volume) sulfuric acid, 50 percent (by volume) hydrochloric acid and ferric chloride. The etchant dissolves the palladium from the nonporous substrate surface but does not remove the palladium from the pores of the resist surface.

After another rinsing, the unit is immersed in a solution from which the desired metal can be deposited. An example of a solution for depositing nickel with a small percentage of boron alloyed therewith is as follows:

| | |
|---|---|
| $NiCl_2 \cdot a6H_20$ | 22 g./liter |
| $Na_4P_20_7 \cdot 10H_20$ | 50 g./liter |
| $NH_4OH$ (58% by wt.) | 20 cc./liter |
| $(CH_{312}$ NHBH3 | 1.5 g./liter |

This bath can be operated at room temperature. In making fine mesh patterns, a more dilute solution is desirable.

After deposition of a thin layer of nickel, additional metal, such as copper, can be deposited electrolytically. In making a self-supporting screen, the copper deposit can have a thickness of about 0.1 mil, for example.

When the electrodeposition is complete, the screen can be peeled from the glass substrate and any resist adhering to the bottom side of the screen can be dissolved with concentrated hydrogen peroxide.

Any article composed of a pattern of metal films or a shaped piece of metal foil can be made by the method described.

The method is also useful form making photomasks that may be used, for example, in making monolithic type integrated circuits, or for microcircuitry applications. In this case, the electroless metal pattern deposited on the resist material, supported on the substrate, is opaque enough to serve as a light barrier. However, it is desirable to provide the metal deposit with a surface layer that is more resistant to abrasion. This may be done by immersing the metal pattern in a solution of a rhodium salt or a ruthenium salt, for example, so that some of the noble metal deposits on the nickel by a chemical replacement reaction. Furthermore, tungsten or molybdenum may be codeposited with nickel to provide improved abrasion resistance.

Many variations are possible in the materials used in the process. The substrate should be a relatively nonporous material. Although glass is preferred, the principal requirement is that the substrate material should have little affinity for the catalyst (activator) in comparison to the resist so that when the activated substrate and resist are both treated at the same time with an etchant, the activating nuclei are dissolved or otherwise deactivated much more rapidly on the nonporous surface than on the more porous surface of the resist.

A catalyst, in this case, is a metal such as palladium which will initiate the electroless deposition process.

The activator (catalyst) and the etchant should be selected together since the etchant must be one that is capable of readily dissolving or otherwise deactivating the activator. Where nickel is being deposited, the activating metal may be iron, cobalt, nickel, ruthenium, rhodium, osmium, iridium, or platinum, besides the palladium mentioned above, as well as other metals such as chromium, silver, gold and copper which are effective in initiating deposition in nickel-boron type electroless baths.

The resist may be any of the commonly used resists which may or may not be photosensitive. Examples of of other photoresists are Shipley AZ1350 positive photoresist and sensitized polyvinyl cinnamates (Eastman Kodak Co. KPR types). Other materials which are not photosensitive, such as polyimides, have also been successfully used in the present method.

Other combinations of substrate and resist which have been used are Mylar and sensitized polyvinyl alcohol; and a ceramic substrate and sensitized polyvinyl alcohol.

The metal deposited electrolessly may be nickel, copper, cobalt, magnetic alloys of other metals such as iron with nickel or cobalt, also molybdenum or tungsten.

Nickel-depositing baths other than the one given in the sample may also be used. A suitable nickel-phosphorus bath is as follows:

| | |
|---|---|
| $NiCl_2 \cdot a6H_2O$ | 7.1 g./liter |
| $NaH_2PO_2 \cdot H_2O$ | 8.3 g./liter |
| $Na_4P_2O_7 \cdot 10H_2O$ | 17 g./liter |
| $NH_4OH$ (58% by wt.) | 3.5 cc./liter |

An example of a cobalt deposition bath is the following:

| | |
|---|---|
| $CoSO_4 \cdot H_2O$ | 9.1 g./liter |
| $Na_4P_2O_7 \cdot 10H_2O$ | 12 g./liter |
| $(CH_3)_2NHBH_3$ | 0.3 g./liter |
| $NH_4OH$ (58% by wt.) | 1.3 cc./liter |

The method of the present invention can also be used for making so-called flush-type printed circuits in which the upper surface of the conductors is in the same plane as the surface of the insulating material. The metal of the circuit pattern can be deposited by a combination of electroless and electrolytic plating techniques, as described, and then covering the pattern with an uncured resin such as an epoxy resin which, after curing, becomes the matrix in which the pattern of conductors is embedded. After curing the resin, this unit is stripped away from the original substrate and the pattern of conductors is thus exposed at the surface of the matrix.

What is claimed is:

1. A method of selectively plating a metal on a nonporous, insulating substrate, comprising:
   - depositing an organic resist material in a predetermined pattern of said substrate, said substrate being not a porous as said resist, thereby leaving portions of said substrate exposed,
   - sensitizing and activating for the electroless deposition of a metal, both the exposed portions of said substrate and the surface of said resist,
   - treating the sensitized and activated surfaces with an etching solution such that only the exposed portions of said substrate are deactivated, and
   - treating both the activated and deactivated surfaces with an electroless metal plating bath such that metal deposits only on said activated surface of said resist 2. A method according to claim 1 in which said resist is a photoresist.

3. A method according to claim 2 in which said photoresist is a dichromate-sensitized fish glue.

4. A method according to claim 2 in which said photoresist is a dichromate-sensitized polyvinyl alcohol.

5. A method according to claim 1 in which said substrate is a vitreous substrate.

6. A method according to claim 5 in which said substrate is glass.

7. A method according to claim 1 in which said metal being deposited electrolessly is nickel.

8. A method according to claim 1 in which said activator is palladium.

9. A method according to claim 1 in which said etchant is ferric chloride.

10. A method according to claim 1 in which the article being made is a photomask and said substrate is glass.

11. A method of making a metal article composed of a pattern of connected film portions, comprising:
   - depositing an organic resist material in the form of said pattern on an insulating substrate which is not as porous as said resist, leaving portions of said substrate exposed,
   - sensitizing and activating for the electroless deposition of a metal, both the exposed portions of said substrate and the surface of said resist,
   - treating the sensitized and activated surfaces with an etching solution such that only the exposed portions of said substrate are deactivated,
   - treating both the activated and deactivated surfaces with an electroless metal plating solution such that metal deposits only on said activated surfaces of said resist pattern,
   - reinforcing said metal deposit with additional metal by electrodeposition, and
   - separating the metal deposit from the resist pattern.

12. A method according to claim 10 in which said pattern is a mesh.

13. A method according to claim 10 in which said metal deposited electrolessly is nickel and said reinforcing metal is electroplated copper.

14. A method of making a flush type circuit in which a pattern of conductors is embedded in a dielectric material, comprising:
   - depositing an organic resist material in the form of the desired metal pattern on an insulating substrate which is not as porous as said resist, leaving portions of the substrate exposed,
   - sensitizing and activating for the electroless deposition of a metal, both the exposed portions of said substrate and the surface of said resist,
   - treating the sensitized and activated surfaces with an etching solution such that only the exposed portions of said substrate are deactivated,
   - treating both the activated and deactivated surfaces with an electroless metal plating solution such that metal deposits only on said activated surfaces of said resist pattern,
   - covering the deposited metal pattern with a layer of a curable synthetic resin in its uncured state,
   - curing said resin, and
   - separating the cured resin layer, with metal pattern embedded therein, from the original substrate.

* * * * *

UNITED STATES PATENT OFFICE
CERTIFICATE OF CORRECTION

Patent No. 3,619,285 Dated November 9, 1971

Inventor(s) Nathan Feldstein

It is certified that error appears in the above-identified patent and that said Letters Patent are hereby corrected as shown below:

Col. 1, line 55, after the period (.) insert -- Also pinholes in the resist layer may lead to possible shorts. --

Col. 2, line 10, after "it" change "will" to -- with --

Col. 2, line 51, should read:
$NiCl_2.6H_2O$ 22 gms./liter

Col. 2, line 68, after "useful" change "form" to -- for --

Col. 2, line 54, should read:
$(CH_3)_2NHBH_3$ 1.5 g./liter

Col. 3, line 50, should read:
$CoSO_4.7H_2O$ 9.1 gms./liter

Col. 3, line 69, after "not", change "a" to -- as --

Col. 3, line 42, should read:
$NiCl_2.6H_2O$ 7.1 gms./liter

Col. 4, line 9, after "resist" insert-pattern --.

Signed and sealed this 18th day of April 1972.

(SEAL)
Attest:

EDWARD M.FLETCHER,JR.
Attesting Officer

ROBERT GOTTSCHALK
Commissioner of Patents